United States Patent [19]
Cogan et al.

[11] Patent Number: 6,072,681
[45] Date of Patent: Jun. 6, 2000

[54] POWER LINE PROTECTION DEVICES AND METHODS

[76] Inventors: Adrian I. Cogan, 30 Little Cir., Redwood Shores, Calif. 94065; Ram G. Bommakanti, 33 Union Square, Apartment 1122, Union City, Calif. 94587

[21] Appl. No.: 09/128,059
[22] Filed: Aug. 3, 1998
[51] Int. Cl.$^7$ ...................................................... H02H 5/04
[52] U.S. Cl. .......................... 361/106; 361/103; 361/100
[58] Field of Search .................................. 361/93.8, 100, 361/103, 106, 25, 27, 72

[56] References Cited

U.S. PATENT DOCUMENTS

| | | | |
|---|---|---|---|
| 3,697,863 | 10/1972 | Kilner | 323/20 |
| 4,075,674 | 2/1978 | Squiers et al. | 361/27 |
| 4,281,358 | 7/1981 | Plouffe et al. | 361/22 |
| 5,684,663 | 11/1997 | Mitter | 361/106 |

Primary Examiner—Jeffrey Gaffin
Assistant Examiner—Kim Huynh

[57] ABSTRACT

The present invention provides a simple, low cost power line protection device and method suitable for protecting data bus and power lines such as in the USB (Universal Serial Bus) configurations and other power management circuits. In one embodiment of the invention, an improved protection device, controllable by a control circuit, for protecting a power line is provided. The device includes a switch for switching on and off power supplied on the power line, and a detector for detecting a fault condition, such as an overload condition, on the power line. The detector includes a positive temperature coefficient (PTC) resistor thermally coupled to the switch for causing the fault condition to be reported to the control circuit. In this way, when a fault condition occurs, the control circuit activates the switch to switch off power supplied on the power line.

16 Claims, 2 Drawing Sheets

POWER LINE PROTECTION DEVICES AND METHODS

BACKGROUND OF THE INVENTION

The invention relates generally to overload protection devices, and more particularly to those used in computer power bus lines, which power downstream electronic components and power management circuits.

Modern technologies have allowed more and more computers to be connected to one another by way of networking. In a typical network system, a hub is connected to a number of nodes, each of which may be connected to a number of sub-nodes. Moreover, each sub-node may be connected to additional sub-subnodes, and so on. In such a network system, power is typically distributed to the various nodes and sub-nodes, etc. One example of such network environment relates to the recent USB (Universal Serial Bus) standards, e.g., USB Organization, USB Specification, Rev. 1.0, Jan. 15, 1996.

In such a network system, each network node is monitored. Normal operation as well as fault conditions are constantly reported to a control circuit. When a fault condition, e.g., overload condition, occurs at one node or sub-node, it is important that any point of failure not affect the operation of the remaining portions of the network system. In other words, the failure must be localized and isolated in order to achieve high performance in a network system.

Various power bus line protection devices have been proposed. FIGS. 1 and 2 illustrate conventional power line protection devices. In FIG. 1, microcontroller 10 is coupled to, for example, a peripheral port 12 which includes a power line protection device 20. Protection device 20 includes a controller 22 and two electronic components, namely, a p-channel enhancement type field effect transistor (FET) 24 and a positive temperature coefficient (PTC) resistor 26 electrically coupled to FET 24.

Under normal conditions, FET 24 is in the on-state and power is supplied to a peripheral device (not shown) to which peripheral port 12 is coupled.

When a fault condition, e.g., overcurrent condition, occurs, a short circuit exists between node 29 and the ground and PTC resistor 26 heats up and trips (i.e., changes its resistance) to a very large resistance value. Thus, the output current flowing in PTC resistor 26 is limited. Upon sensing a low voltage at the OC (overcurrent) node, controller 22 informs microcontroller 10 of the fault condition, i.e., overcurrent condition. Then, microcontroller 10 instructs controller 22 to send a logic signal, via the PC (power control) node, to the gate of FET 24 to turn off FET 24.

The disadvantages of the circuit shown in FIG. 1 are that it has a long trip time, which puts strain on FET 24. Also, it has a larger physical size in order to meet the low resistance requirements for the FET, which thus increases the cost.

In FIG. 2, a dedicated power integrated circuit (IC) 30, which includes a FET 31 and a series resistor 33, is used in a power line protection device 32 in a peripheral port 12. When overload (or overcurrent) conditions occur, controller 26 receives the fault condition report from power IC 30, via the OC node, a high current at the output of power IC 30, and informs microcontroller 10 of the fault condition. Microcontroller 10 then instructs controller 26 to turn off power IC 30, via the node PC.

A main disadvantage of this circuit is cost because, for the same on-resistance, a power IC is more expensive than a vertical FET due to its lateral structure. In order to reduce power loss, it is necessary to minimize the overall resistance of the IC chip. In order to achieve the required low on resistance of the FET, a large silicon IC chip has to be used when coupling to the discrete device in FIG. 1. Therefore, the cost is high.

SUMMARY OF THE INVENTION

The present invention solves the above problems associated with conventional power line protection devices. It provides a simple, low cost power line protection device and method suitable for protecting data bus and power lines such as in USB (Universal Serial Bus) configurations and other power management circuits, e.g., the next generation bus "firewire" or IEEE 1394, etc.

According to one embodiment of the invention, an improved protection device, controllable by a control circuit, for protecting a power line is provided. The device comprises a switch for switching on and off power supplied to the power line, and a detector for detecting a fault condition, such as an overload condition, on the power line. The detector is thermally coupled to the switch for causing the fault condition to be reported to the control circuit. In this way, when a fault condition occurs, the control circuit activates the switch to switch off power supplied on the power line. In this embodiment, the switch is coupled to the power line in series and the detector is coupled to the power line in parallel.

According to this embodiment of the invention, the switch and detector may be packaged as a hybrid type device. Also, the switch may include a field effect transistor (FET) and the detector may include a positive temperature coefficient resistor (PTC).

According to another embodiment of the invention, an improved protection device for protecting a power line is provided. The device comprises a switch for switching on and off power supplied on the power line; s a detector, thermally coupled to the switch, for detecting a fault condition on the power line; and a latching circuit, coupled to the switch and responsive to the detector, for latching the switch to a predetermined state to switch off power supplied on the power line when a fault condition occurs.

According to this embodiment of the invention, the switch, once latched into the predetermined state, remains in the predetermined state even after the fault condition disappears. Also, in this embodiment, the protection device may include a reset circuit, coupled to the latching circuit and responsive to an external command signal, for resetting the latching circuit to cause the switch to switch on power supplied on the power line. In this embodiment, the switch is coupled to the power line in series and the detector is coupled to the power line in parallel.

Moreover, in this embodiment of the invention, the switch, the detector and the latching circuit may be packaged as a hybrid type device. Furthermore, the switch may include a FET; the detector may include a PTC resistor; and the latching circuit may include a triac having a gate coupled to the PTC resistor.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE PREFERRED EMBODIMENTS

Figure 1:
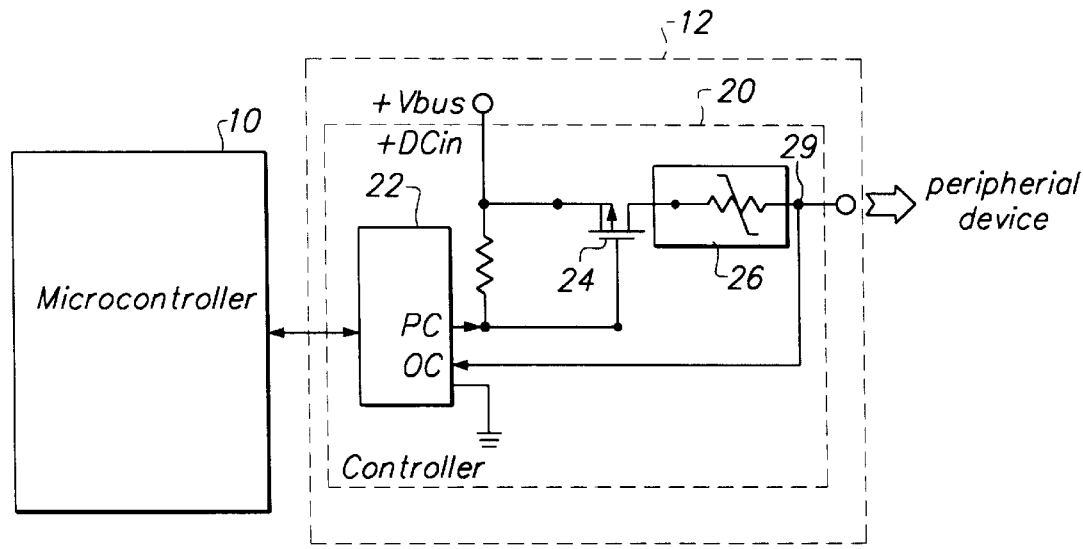
FIGS. 1 and 2 shows conventional power line protection devices.
Figure 2:
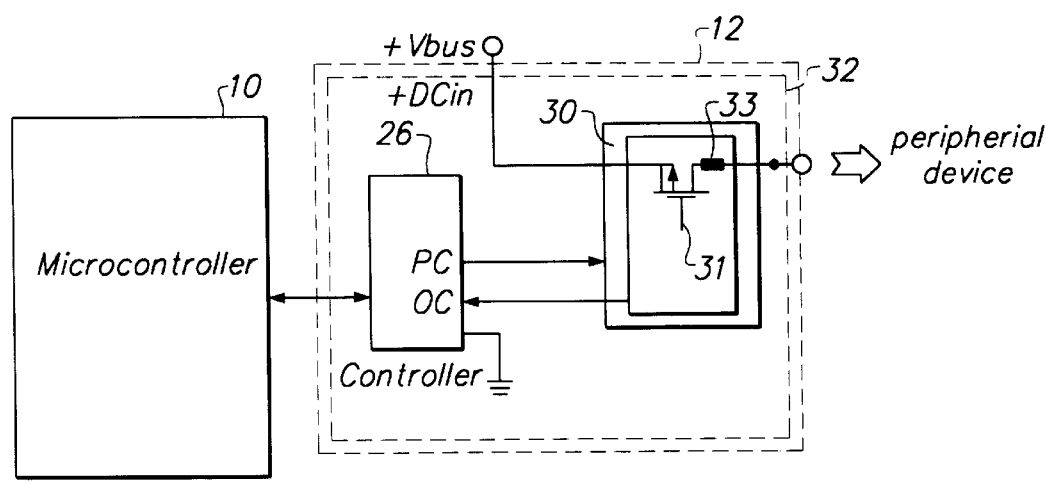
Figure 3:
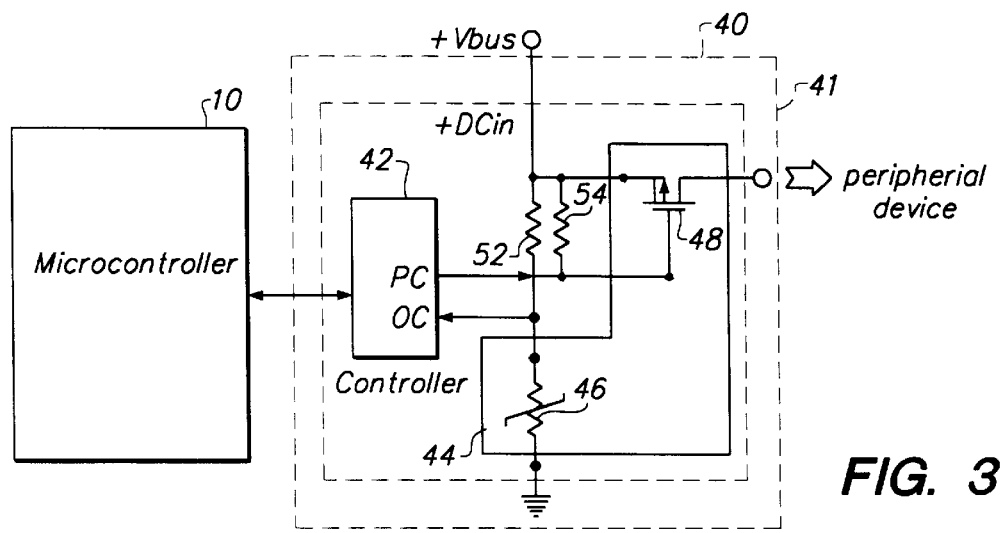
FIG. 3 shows a first embodiment of the present invention.

FIG. 3 illustrates a first embodiment of the present invention. In FIG. 3, a peripheral port 40 is coupled to a microcontroller 10. Peripheral port 40 includes a power line protection device 41 that comprises a controller 42, which may be a TUSB 2040, or TUSB 2070 device manufactured by Texas Instruments in Dallas, Tex. Protection device 41 also includes a silicon hybrid circuit 44 coupled to controller 42. Hybrid device 44 includes a discrete PTC resistor 46 and a discrete p-channel enhancement type FET 48 thermally coupled to each other. Protection device 41 further includes a bias 25 resistor 52 connected between +Vbus and PTC resistor 46, and a gate-tosource resistor 54. Resistor 54 protects FET 48 in case its gate-to-source terminals (input) are left "open" or in an undetermined high impedance state.

In one example, bias resistor 52 has a value of 1M ohms; PTC resistor 46 has a value of 100 ohms under normal conditions and 10M ohms when it is tripped, i.e., it changes its resistance due to heating; and the gate-to-source resistor 54 has a value of 10 k ohms.

Under normal conditions, FET 48 is in the on state and power is supplied from +Vbus to a peripheral device (not shown) to which peripheral port 41 is coupled.

When overload conditions occur, FET 48 heats up, causing PTC resistor 46 to trip to a very large resistance, e.g., 10M ohms. As a result, the voltage value of the OC node of controller 42 is pulled up to approximately +Vbus. When the OC node senses a high state (+Vbus), it sends a signal to microcontroller 10, which instructs controller 42 to send a high state signal to the gate of FET 48, via the PC node, to turn off FET 48. Thus, power is no longer supplied to the peripheral device.

After FET 48 cools down, the resistance value of PTC resistor 46 decreases. At this time, the OC node senses a low state and controller 42 then sends a signal to microcontroller 10, indicating that overload conditions do not exist any more. Microcontroller 10 then instructs controller 42 to send a low state signal to the gate of FET 48, via the PC node, to turn on FET 48. Thus, after the overload conditions disappear, power is automatically restored.

Figure 4:
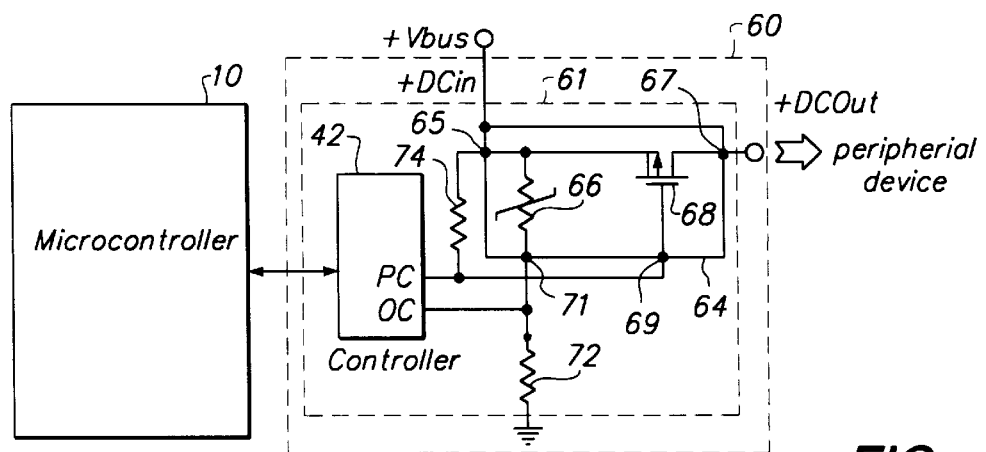
FIG. 4 shows a second embodiment of the present invention.

FIG. 4 illustrates a second embodiment of the present invention. The operation of this embodiment is similar to that in the first embodiment shown in FIG. 3. In FIG. 4, a peripheral port 60 is coupled to a microcontroller 10. Peripheral port 60 includes a power line protection circuit 61 that comprises a controller 42 and a silicon hybrid circuit 64. Hybrid circuit 64 includes a discrete PTC resistor 66 and a discrete p-channel enhancement type FET 68 thermally coupled to each other. As shown in FIG. 4, hybrid circuit 64 also includes a voltage bus terminal 65, a voltage output terminal 67, a control terminal 69, and a voltage return terminal 71. One end of the PTC resistor 66 and the source electrode of the FET 68 connect to the voltage bus terminal 65. A second end of the PTC resistor 66 connects to the voltage return terminal 71. The drain electrode of the FET 68 connects to the voltage output terminal 67, and the gate electrode of the FET 68 connects to the control terminal 69.

Protection device 61 also includes a bias resistor 72 coupled between PTC resistor 66 and the ground level, and a gate-to-source resistor 74. Resistor 74 protects FET 68 in case its gate input is left "open" or in an undetermined high impedance state.

Under normal conditions, FET 68 is in the on state and power is supplied from +Vbus to a peripheral device (not shown) to which peripheral port 61 is coupled.

In one example, bias resistor 72 has a value of 1M ohms; PTC resistor 66 has a value of 100 ohms under normal conditions and 10M ohms when it is tripped; and gate-to-source resistor 74 has a value of 10 k ohms.

When overload conditions occur, FET 68 heats up, causing PTC resistor 66 to trip and become a very large resistance, e.g., 10M ohms. As a result, the voltage value of return terminal 71 and the OC node of controller 42 is pulled down to approximately the ground level. When the OC node senses a low state, it sends a signal to microcontroller 10, which instructs controller 42 to send a high state signal, via the PC node and control terminal 69, to turn off FET 68.

After FET 68 cools down, the resistance value of PTC resistor 66 decreases. At this time, the OC node senses a high state (+Vbus) and controller 42 then sends a signal to microcontroller 10, indicating that overload conditions do not exist any more. Microcontroller 10 then instructs controller 42, to send a low state signal, via the PC node, to turn on FET 68. Thus, after the overload conditions disappear, power is automatically resumed.

Figure 5:
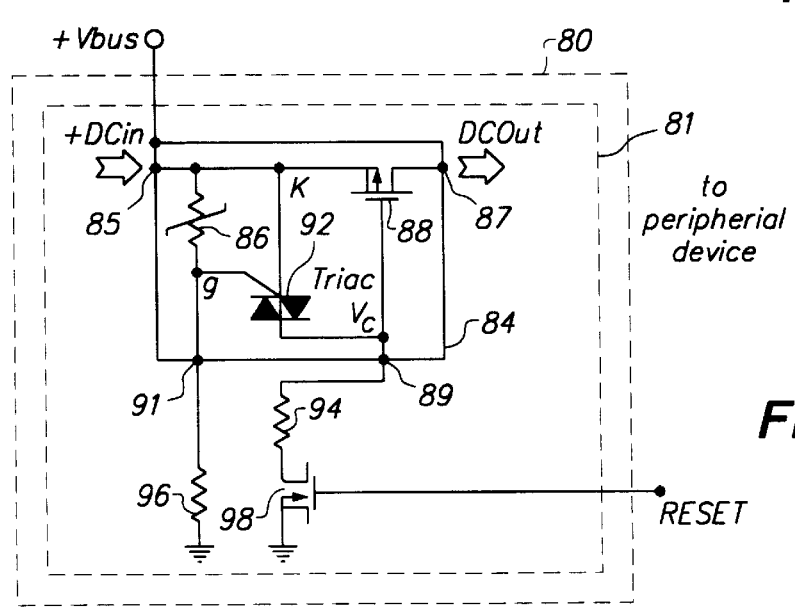
FIG. 5 shows a third embodiment of the present invention.

FIG. 5 illustrates a third embodiment of the present invention. In FIG. 5, a peripheral port 80 includes a power line protection device 81, which comprises a silicon hybrid circuit 84, resistors 94 and 96, and a n-channel enhancement type FET 98. Hybrid circuit 84 includes a discrete PTC resistor 86, a discrete p-channel enhancement type FET chip 88 and a discrete triac die 92. As shown in FIG. 5, hybrid circuit 84 also includes a voltage bus terminal 85, a voltage output terminal 87, a control terminal 89, and a voltage return terminal 91. One end of the PTC resistor 86, a first anode of the triac 92 and the source electrode of the FET 88 are connected to the voltage bus terminal 85. The drain electrode of the FET 88 connects to the voltage output terminal 87. A second anode of the triac 92 and the gate electrode of the FET 88 connect to the control terminal 89. A second end of the PTC resistor 86 and a gate electrode of the triac 92 connect to the voltage return terminal 71. PTC resistor 86, functioning as a sensing resistor, is coupled to the gate of triac 92 and is also thermally coupled to FET 88.

In one example, resistor 94 has a value of 1k ohms; resistor 96 has a value of 1M ohms. PTC resistor 86 has a value of 100 ohms under normal conditions and 10M ohms when it is tripped.

Under the normal condition, PTC resistor 86 acts like a short circuit. Therefore, the gate voltage Vgk of triac 92 is approximately equal to zero and triac 92 is off. Under the normal condition, no current flows through triac 92, resistor 94 and FET 98, and FET 88 is normally on, allowing power to be supplied on the power line to the peripheral device (not shown).

When overload conditions occur, FET 88 heats up and the sensing resistor 86 trips to a very large resistance, e.g., 10M ohms, causing Vgk to become a high value of +Vbus. A high value of the voltage across PTC resistor 86, Vgk, causes triac 92 to turn on, which causes the control voltage Vc to become a high value of +Vbus. The high value of Vc at control terminal 89 turns off FET 88. Thus, power is switched off.

Triac 92, once turned on, stays on and behaves as a short circuit even after PTC resistor 86 cools down and Vgk becomes a low value. This effectively latches FET 88 in the off position. Thus, power stays switched off and is no longer supplied to the peripheral device (not shown) to which peripheral port 80 is coupled, even after the overload conditions disappear.

A reset switch FET 98 is provided and is controllable by an external signal which may be supplied by a microcontroller, for example. Alternatively, FET 98 may be manually controlled. After triac 92 is turned on and the power is switched off, triac 92 may be reset by momentarily turning off FET 98 so that no current flows through triac 92. After triac 92 is reset and turned off, the control voltage Vc becomes a low value. A low value of Vc turns on FET 88, thus restoring power supply to the peripheral device. Triac 92, once turned off, stays off and behaves as an open circuit, even after the reset switch is released and is in the on state. Therefore, FET 88 stays on after reset switch is released.

While the invention has been described in conjunction with several specific embodiments, it is evident to those skilled in the art that many further alternatives, modifications and variations will be apparent in light of the foregoing description. For example, in the embodiment shown in FIG. 5, other types of latching mechanism, e.g., a thyristor may also be used instead of the triac. Also, an n-channel FET may be used instead of the p-channel FET, provided that appropriate bias voltages are applied. Additionally, a negative temperature coefficient (NTC) resistor may be used in place of the PTC resistor with appropriate changes in the polarities and logic sequences. Thus, the invention described herein is intended to embrace all such alternatives, modifications and variations as may fall within the spirit and scope of the appended claims.

What is claimed is:

1. A protection device for protecting a power line, the device comprising:
    (a) a transistor having an input electrode for receiving an input voltage signal, an output electrode for outputting the voltage signal to an electrical load via the power line and a control electrode for receiving a control signal;
    (b) a series circuit coupled between the input voltage signal and a voltage return, the series circuit including:
        (i) a first bias resistor coupled to the voltage return,
        (ii) a positive temperature coefficient (PTC) element coupled from the input voltage signal to the first bias resistor, the PTC element being also thermally coupled to the transistor; and
    (c) a triac coupled between the input voltage signal and a reference voltage level, the triac having a gate terminal coupled to a node between the first bias resistor and the PTC element for receiving an activating signal, the triac also having a first anode connected to the input voltage signal, and a second anode forming an output node for outputting the control signal to the control electrode of the transistor upon receiving the activating signal;
    (d) a second bias resistor having a first end coupled to the second anode and a second end coupled to a voltage return;
wherein the PTC element detects a fault condition on the power line and causes the activating signal to be sent to the triac upon detection of the fault condition;
wherein upon receiving the activating signal, the triac sends a control voltage to the control electrode of the transistor to latch the transistor into an off state; and
wherein the transistor, once latched into the off state, remains in the off state even after the fault condition disappears.

2. The device of claim 1 wherein the latching circuit further includes a reset circuit coupled between the second end of the second bias resistor and the voltage return, and responsive to an external command signal, for, after the triac has been turned on, resetting the triac to a non-conducting state so as to cause the transistor to switch on.

3. The device of claim 1 wherein the transistor, the triac and the PTC element are assembled and connected upon a common substrate as a hybrid type device.

4. The device of claim 1 wherein the fault condition includes an overload condition.

5. The device of claim 1 wherein the fault condition includes an overcurrent condition.

6. A four-terminal protection device for protecting a power line from an overload condition, the device comprising:
    an electrically insulative, thermally conductive substrate having a voltage supply terminal for connection to a positive voltage supply, a voltage output terminal for supplying voltage to the power line, a control terminal, and a voltage return terminal;
    a field effect transistor (FET) chip secured to the substrate and having a source electrode connected to the voltage supply terminal, a drain electrode connected to the voltage output terminal, and an insulated gate electrode connected to the control terminal;
    a positive temperature coefficient (PTC) resistance element secured to the substrate in thermal contact with the FET chip and having a first end connected to the voltage supply terminal and a second end connected to the voltage return terminal;
    a FET bias resistor having a first end connected to the voltage supply terminal and a second end connected to the control terminal for supplying a normal bias voltage to cause the FET chip to be conductive;
    the protection device for use within a protection circuit including a first bias resistor connected between the voltage return terminal and a voltage ground, and a control element having an input connected to the voltage return terminal and a control output connected to the control terminal,
    whereby excessive temperature generated by the FET chip caused by an overload causes the PTC resistance element to trip to a high resistance state thereby changing voltage level at the voltage return terminal which is sensed by the control element and which causes the control element to put out an off bias voltage level to override the normal bias voltage and cause the FET chip to become non-conductive.

7. The four-terminal protection device of claim 6 wherein the control element comprises a digital interface circuit and a programmed microcontroller connected to the digital interface circuit such that the changing voltage level at the voltage return terminal causes the microcontroller to send a FET turnoff signal through the digital interface circuit to put out the off bias voltage level to cause the FET chip to become non-conductive.

8. The four-terminal protection device of claim 6 wherein the PTC resistance element has a resistance which is approximately 100,000 times higher in the tripped high resistance state than in a non-tripped state.

9. The four-terminal protection device of claim 8 wherein the PTC resistance element has an electrical resistance of approximately ten million ohms in the high resistance tripped state and has an electrical resistance of approximately 100 ohms in the non-tripped state.

10. A four-terminal protection device for protecting a power line from an overload condition, the device comprising:

an electrically insulative, thermally conductive substrate having a voltage input terminal for connection to a positive voltage supply, a voltage output terminal for supplying voltage to the power line, a control terminal, and a voltage return terminal;

an enhancement mode p-channel field effect transistor (FET) chip secured to the substrate and having a source electrode connected to the voltage input terminal, a drain electrode connected to the voltage output terminal, and an insulated gate electrode connected to the control terminal;

a positive temperature coefficient (PTC) resistance element secured to the substrate in thermal contact with the FET chip and having a first end connected to the voltage input terminal and a second end connected to the voltage return terminal;

a bistable semiconductor device chip secured to the substrate and having a first anode connected to the voltage input terminal, a second anode connected to the control terminal and a control electrode connected to the voltage return terminal;

the protection device for use within a protection circuit including a first bias resistor connected between the voltage return terminal and a voltage ground, and a second bias resistor connected between the control terminal and ground;

whereby excessive temperature generated by the FET chip caused by an overload causes the PTC resistance element to trip to a high resistance state thereby changing voltage level at the voltage return terminal and causing the bistable semiconductor device chip to latch to a conductive state which applies an off bias voltage to the gate electrode to turn off the FET chip, the bistable semiconductor device chip remaining in the conductive state until being separately reset to a non-conductive condition even though the overload condition has been removed from the power line.

11. The device of claim 10 wherein the bistable semiconductor device chip comprises a triac.

12. The device of claim 10 further comprising a reset element in series between the second bias resistor and ground.

13. The device of claim 12 wherein the reset element comprises a second FET having a drain electrode connected to the second bias resistor, a source electrode connected to ground, and a gate electrode connected to receive a reset signal.

14. The device of claim 12 further comprising a programmed microcontroller connected to the reset element for providing a reset signal to reset the bistable semiconductor device chip.

15. The four-terminal protection device of claim 10 wherein the PTC resistance element has a resistance which is approximately 100,000 times higher in the tripped high resistance state than in a non-tripped state.

16. The four-terminal protection device of claim 15 wherein the PTC resistance element has an electrical resistance of approximately ten million ohms in the high resistance tripped state and has an electrical resistance of approximately 100 ohms in the non-tripped state.

* * * * *